United States Patent [19]

Gilbert

[11] 4,080,028

[45] Mar. 21, 1978

[54] PRINTED CIRCUIT BOARD CONNECTOR ADAPTER

[75] Inventor: Donald Edmond Gilbert, Houston, Tex.

[73] Assignee: Powell Electrical Manufacturing Company, Houston, Tex.

[21] Appl. No.: 748,779

[22] Filed: Dec. 9, 1976

[51] Int. Cl.[2] .......................... H05K 1/07; H05K 1/18

[52] U.S. Cl. ............................ 339/17 L; 339/154 A; 339/193 VS

[58] Field of Search .............. 339/17 C, 17 L, 17 LC, 339/17 D, 17 M, 17 LM, 154 R, 154 A, 155 R, 155 T, 156 R, 156 T, 176 MP, 193 P, 193 VS, 275 B

[56] References Cited

U.S. PATENT DOCUMENTS

| | | | |
|---|---|---|---|
| 2,904,768 | 9/1959 | Rasmussen | 339/17 LM |
| 2,905,921 | 9/1959 | Barwick | 339/193 P |
| 2,915,653 | 12/1959 | Mann | 339/193 VS |
| 3,177,461 | 4/1965 | Hagan et al. | 339/184 M |
| 3,587,029 | 6/1971 | Knowles | 339/176 MP |
| 3,827,004 | 7/1974 | Vanden Heuvel et al. | 339/275 B |
| 3,924,916 | 12/1975 | Venaleck | 339/193 P |

*Primary Examiner*—Roy Lake
*Assistant Examiner*—Neil Abrams
*Attorney, Agent, or Firm*—Murray Robinson; David M. Ostfeld; Ned L. Conley

[57] ABSTRACT

A device, including at least one tube/relay plug, at least one printed circuit board connector and an interface board, uniquely designed to adapt a printed circuit card for connection to at least one tube/relay socket. The tube/relay plug and the printed circuit board connector are attached to the interface board such that the pins of the plugs extend in one direction and the connector opens in the opposite direction. The interface board is provided with electrical conductors connecting the plug and the connector. One or more card guide means may be attached to the interface board for facilitating insertion of the printed circuit card into the connector and for supporting the card when it is in position.

2 Claims, 4 Drawing Figures

PRINTED CIRCUIT BOARD CONNECTOR ADAPTER

BACKGROUND OF THE INVENTION

1. Field of the Invention

The present invention relates generally to electrical connectors and more particularly to a device that adapts a printed circuit card for connection to a tube/relay socket.

2. Description of the Prior Art

The rapidly changing field of electronics and electronic packaging has recently witnessed the demise of vacuum tubes and hand-wired circuits and the rise of semiconductors and printed circuits. As a result of these changes, cabinets and chassis having tube/relay sockets, including octal sockets designed to receive vacuum tubes and hermetically-sealed cans containing hand-wired circuits, have been replaced by cabinets and chassis having printed circuit connectors designed to receive printed circuit cards. In some cases, the old cabinets and chassis have been discarded resulting in a substantial loss. In other cases, the chassis have been substantially modified by replacing the tube/relay sockets with printed circuit board connectors and rewiring the interconnections. In either situation, the replacement is costly and renders equipment inoperative for long periods of time.

None of the prior art employs economical means for adapting the original chassis to receive printed circuit cards while retaining the tube/relay sockets.

SUMMARY OF THE INVENTION

The present invention utilizes a unique device to adapt a chassis having tube/relay sockets to receive printed circuit cards while retaining the tube/relay sockets. The device includes an interface board with a printed circuit connector attached to it and opening in a first direction. A plurality of tube/relay plugs are also attached to the interface board such that the pins of the plugs extend from the interface board in a direction opposite the first direction. The board is provided with electrical conductors that connect corresponding terminals of the socket to terminals of the connector.

BRIEF DESCRIPTION OF THE DRAWINGS

For a further understanding of the nature and objects of the present invention, reference should be made to the following detailed description, taken in conjunction with the accompanying drawings, in which like parts are given like reference numerals and wherein.

DETAILED DESCRIPTION OF THE PREFERRED EMBODIMENT

Figure 1:
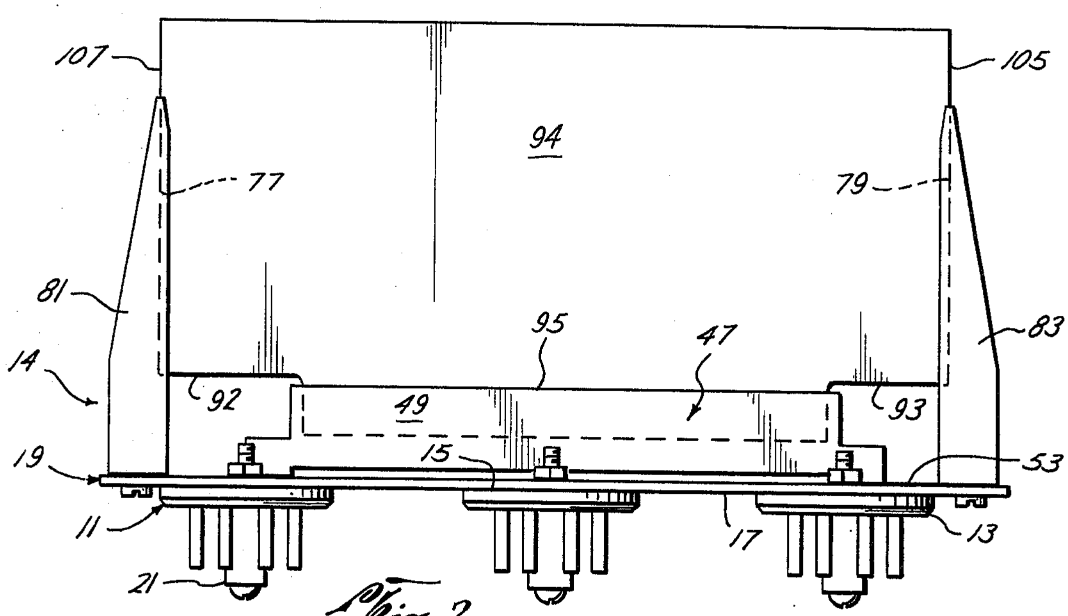
FIG. 1 is a front elevation of the preferred embodiment of the apparatus of the invention.
Figure 2:
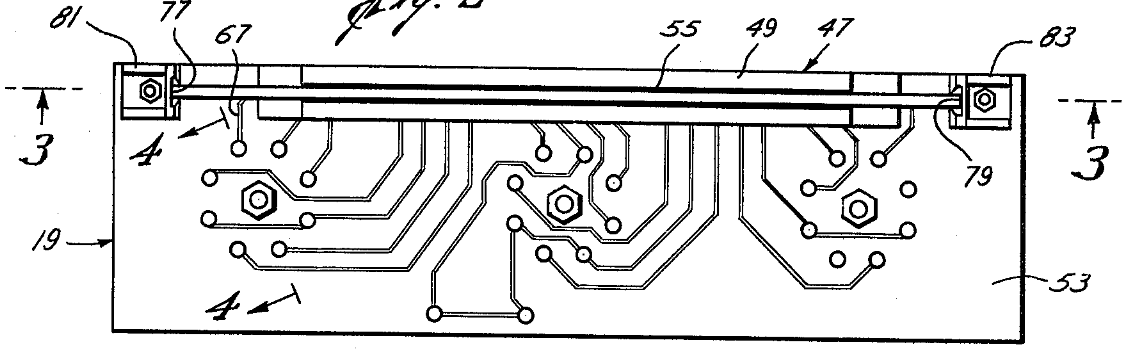
FIG. 2 is a top view of the preferred embodiment of the apparatus of the invention.

The adapter of the present invention is shown in FIGS. 1 and 2. The adapter comprises plugs 11, card holder and connector 14, and interface board 19. Connector 14 includes printed circuit board connector 47. Plugs 11 and connector 14 are mechanically connected to interface board 19. Plugs 11 are electrically connected to printed circuit board connector 14 by the use of a plurality of lands 67 etched on interface board 19. Lands 67 are electrically connected to conductive portions of plugs 11 and connector 14.

Figure 4:
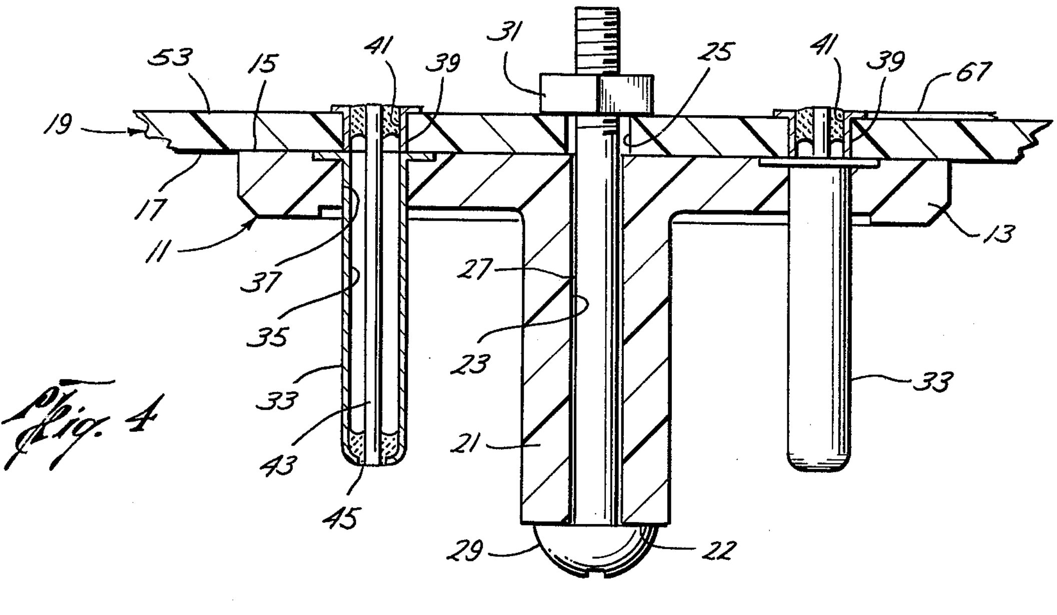
FIG. 4 is an enlarged section of the embodiment of FIG. 2 taken along line 4—4 and showing the preferred means for attaching the tube/relay plugs to the board.

As shown in FIGS. 2 and 4, tube/relay plugs 11 have electrically non-conductive plug bodies 13. Plug bodies 13 have flat surface 15 resting against surface 17 of interface board 19. A center post 21 is connected to each plug body 13 and extends away from board 19. A screw passage 23 extends through each plug body 13 and center post 21. Each screw passage 23 is coaxial to and communicates with a screw aperture 25 through board 19. A screw 27 extends through each combination of screw passage 23 and screw aperture 25 such that screw head 29 rests against surface 22 of center post 21. The other end of screw 27 is secured by a nut 31 resting against surface 53 of board 19.

A plurality of electrically conductive pins 33 are connected to plug body 13 and extend from body 13 and parallel to center post 21. Each pin 33 has a lug passageway 35 through it. Each lug passageway 35 is coaxial to and communicates with a plug body passageway 37 through plug body 13. Each plug body passageway 37 is coaxial to and communicates with a lug aperture 39 through board 19. The entire wall of each lug aperture 39 is covered by a conductive foil feed-through 41. A solder lug 43 extends through each combination of lug passageway 35, plug body passageway 37, and lug aperture 39. Solder lug 43 is soldered at one end to tip 45 of the corresponding pin 33 and at the other end to the corresponding feedthrough 41.

Figure 3:
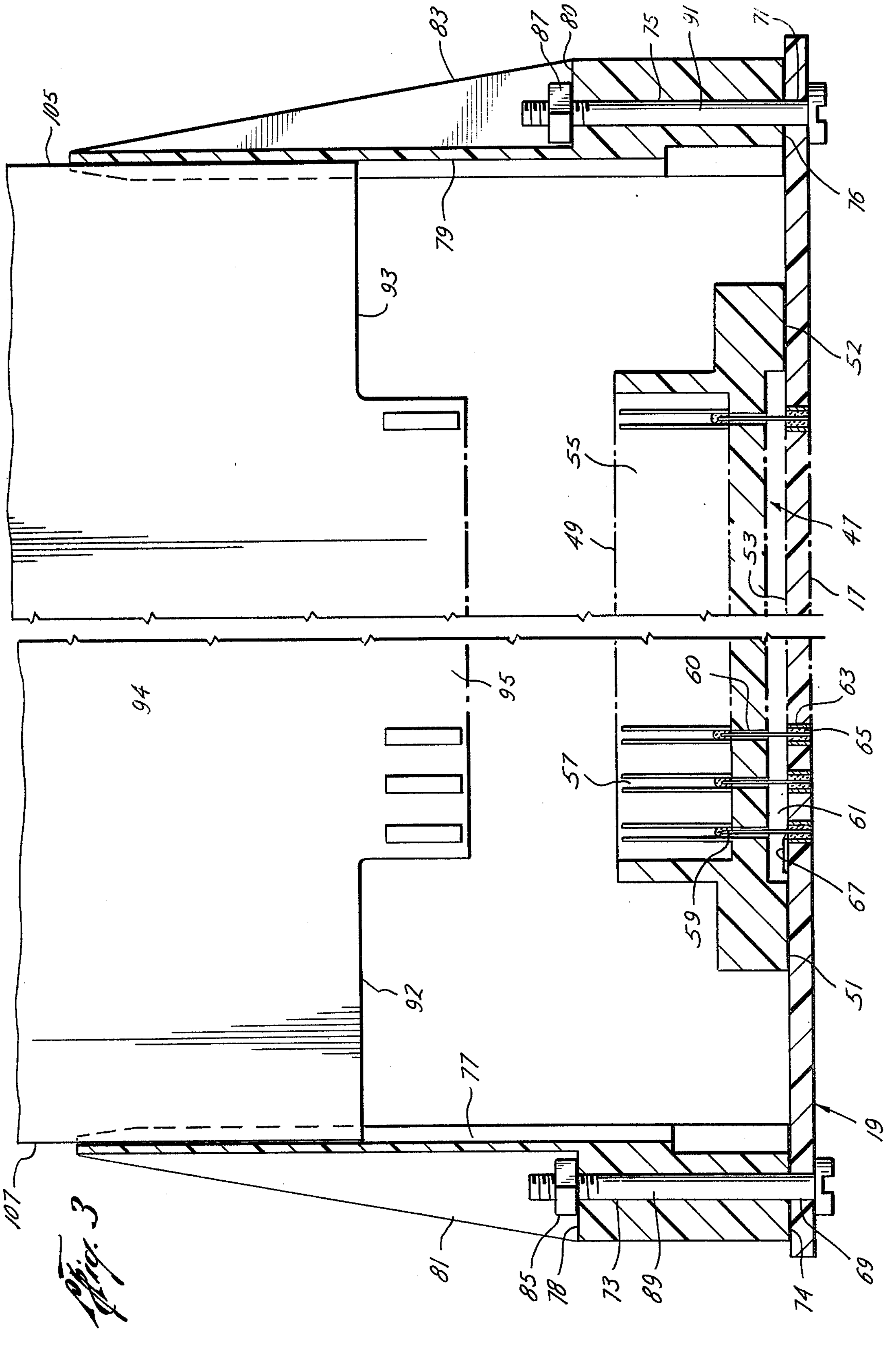
FIG. 3 is an enlarged section of the embodiment of FIG. 2 taken along line 3—3 and showing the preferred means for attaching the printed circuit board connector to the interface board.

As shown in the Figures, interface board 19 is flat and generally rectangular in shape. It is made of electrically non-conductive material. Interface board 19 includes lug apertures 63 covered with a conductive foil feed-through 65. Lands 67 on board 19 electrically interconnect feed throughs 65 with feed throughs 41. As shown in FIG. 3, interface board 19 also has screw holes 69, 71 spaced to either side of connector 47 along the same line as that formed by the lateral axis of connector 47.

As shown in FIGS. 1-3, printed circuit board connector 47 includes elongate, non-conductive connector body 49. Connector body 49 has flat surfaces 51, 52 resting against surface 53 of board 19. Connector body 49 further has female edge connector socket portion 55 opening away from surface 53. Within socket portion 55 is a plurality of electrically conductive contacts 57. Each contact 57 is electrically connected to a solder lug 59 which extends through apertures 60 in connector body 49 toward board 19. As at 61, the end of each solder lug 59 extends into a lug aperture 63 of board 19. Solder lugs 59 are soldered to corresponding feed throughs 65. The soldering provides both electrical and mechanical connection between interface board 19 and connector 47. In the preferred embodiment a twenty-two pin socket 55 is utilized. However, a forty-four pin socket or other type pin configuration could also be used. For a forty-four pin socket, one row of twenty-two of the solder lugs could be connected electrically to the other row or all forty-four solder lugs could be extended to board 19.

Printed circuit board connector 47 is adapted to receive card 94. Card 94 includes connector 95 at one end, forming shoulders 92, 93 with the body of the card. Card 94 further includes socket edges 105, 107.

The spacing of holes 69, 71 with respect to connector 47 is determined by the length of shoulders 92, 93 respectively. In the preferred embodiment, the shoulders 92, 93 are of unequal length, and the spacing of hole 69 from one side of connector 47 is not equal to the spacing of hole 71 from the other side of connector 47.

Card guides 81, 83 are attached to board 19 using holes 69, 71 respectively for connection. Card guides 81, 83 have guide attachment holes 73, 75, guide slots 77, 79, and shoulders 78, 80, respectively. Screws 89, 91 extend through holes 69, 73, and 71, 75 respectively. Nuts 85, 87 resting against shoulders 78, 80 respectively hold screws 89, 91 in place, thereby holding lower surfaces 74, 76 of guies 81, 83 respectively against surfaces 53 of card 19. Guides 81, 83 extend perpendicularly above surface 53 such that slots 77, 79 face toward each other.

Manufacture of the preferred embodiment of the invention includes the principle steps of layout planning, preparation of interface board, and assembly. Layout planning varies widely depending on the particular adaptation to be made. The principal aspect of layout planning involves interfacing; i.e.: determining how the tube/relay plugs and the printed circuit board connector are to be interconnected by the printed circuit paths. This determination depends on the contact arrangement of the printed circuit board 94 to be adapted to the sockets. Layout planning also involves determination of the positions of the connector and the tube/relay plugs. This determination depends on the location and general orientation of the tube/relay sockets to which the printed circuit board 94 is to be adapted.

When layout planning is completed, lug apertures 39, 63, screw apertures 25 and screw holes 69, 71 are provided in board 19 by drilling or stamping, or some equivalent method. Feedthroughs 41, 65 and printed circuit paths 67 are then etched within apertures 39, 63 and on surface 53 of board 19 by methods well known in the art of printed circuit board manufacture.

Assembly includes attaching connector 47 to board 19 on surface 53 by guiding solder lugs 59 of connector 47 into lug apertures 63 and applying a solder drop to each aperture 63. Assembly further includes attaching plugs 11 to board 19 on surface 17 by guiding solder lugs 43 into lug apertures 39 and applying a solder drop to each aperture 39. Plugs 11 are further secured to board 19 by means of screws 27 and nuts 31. Assembly also includes attaching card guides 81, 83 to interface card 19 by means of screws 89, 91 and nuts 85, 87, respectively.

In operation, a printed circuit card 94, having connector edge 95, is inserted into connector 47 by moving edges 105, 107 into slots 79, 77 respectively. Because guides 81, 83 are not equally spaced from connector 47, card 94 should be designed such that the length of shoulders 92, 93 are unequal, i.e.: connector edge 95 is not centered on card 94. In this way, proper orientation of card 94 in connector 47 is assured.

Card 94 can then be quickly interfaced into a circuit having tube/relay type sockets on a chassis by inserting plugs 11 into the appropriate sockets on the chassis.

Although the system described in detail supra has been found to be the most satisfactory and preferred, many variations in structure are possible. For example, the plugs and connectors may have a smaller or greater number of pins. Moreover, a single apparatus may include more than one printed circuit connector. Also, the interfacing may be accomplished by means other than printed circuit paths and feedthroughs, such as wires extending between and soldered to the solder lugs of the plugs and the connector.

The above are merely exemplary of the possible changes or variations.

Because many varying and different embodiments may be made within the scope of the inventive concept herein taught and because many modifications may be made in the embodiment herein detailed in accordance with the descriptive requirements of the law, it should be understood that the details herein are to be interpreted as illustrative and not in a limiting sense.

What is claimed as invention is:

1. A device for adapting a printed circuit card, such card adapted to be detachably received by a printed circuit connector, for connection to a plurality of tube/-relay sockets, comprising:

a rigid interface board;

a plurality of tube/relay plugs having means thereon for connecting each of said plurality of tube/relay plugs to a corresponding tube/relay socket including a plurality of pins extending from each of said plugs;

means for connecting said plugs to said board such that said pins extend away from said board;

a printed circuit connector having socket means for receiving such card, said socket means having a plurality of contacts therein;

means for connecting said connector to said board such that said socket opens away from said board; and means supported by said board for interconnecting said contacts and said pins;

said means for interconnecting said contacts and said pins including printed circuit paths etched onto said board and first conductors connecting said pins to said paths;

said board having a plurality of lug apertures therethrough; said paths extend to said lug apertures; and said first conductors include solder lugs disposed in said lug apertures and connected to said pins, conductive feed throughs disposed in said lug apertures and electrically connected to said paths, and solder drops bridging between said solder lugs and said feed throughs.

2. A device for adapting a printed circuit card, such card adapted too be detachably received by a printed circuit connector, for connection to a plurality of tube/-relay sockets, comprising:

a rigid interface board;

a plurality of tube/relay plugs having means thereon for connecting each of said plurality of tube/relay plugs to a corresponding tube/relay socket including a plurality of pins extending from each of said plugs;

means for connecting said plugs to said board such that said pins extend away from said board;

a printed circuit connector having socket means for receiving such card, said socket means having a plurality of contacts therein;

means for connecting said connector to said board such that said socket opens away from said board; and means supported by said board for interconnecting said contacts and said pins, pins including printed circuit paths etched onto said board and conductors connecting said contacts to said paths;

said board having a plurality of lug apertures therethrough; said paths extend to said lug apertures; and said conductors include solder lugs disposed in said lug apertures and connected to said contacts, conductive feed throughs disposed in said lug apertures and electrically connected to said paths, and solder drops bridging between said solder lugs and said feed throughs.

* * * * *